United States Patent
Rajagopal et al.

(10) Patent No.: US 9,008,235 B2
(45) Date of Patent: Apr. 14, 2015

(54) RECEIVER WITH REDUCED WAKE-UP TIME

(71) Applicant: Broadcom Corporation, Irvine, CA (US)

(72) Inventors: Ravikiran Rajagopal, Costa Mesa, CA (US); Jeffrey Scott Putnam, Irvine, CA (US); Ramon Gomez, San Juan Capistrano, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/770,683

(22) Filed: Feb. 19, 2013

(65) Prior Publication Data

US 2014/0233679 A1 Aug. 21, 2014

(51) Int. Cl.
*H04L 27/06* (2006.01)
*H04L 27/26* (2006.01)

(52) U.S. Cl.
CPC .................................. *H04L 27/2649* (2013.01)

(58) Field of Classification Search
USPC ................. 375/260, 316, 340, 342, 346, 350; 455/132–133, 343.1–343.2
See application file for complete search history.

(56) References Cited

U.S. PATENT DOCUMENTS

| | | | | |
|---|---|---|---|---|
| 6,167,099 A | * | 12/2000 | Rader et al. | 375/347 |
| 6,356,067 B1 | * | 3/2002 | Nara | 324/76.23 |
| 6,678,508 B1 | * | 1/2004 | Koilpillai et al. | 455/137 |
| 6,804,503 B2 | * | 10/2004 | Shohara et al. | 455/343.4 |
| 8,290,031 B1 | * | 10/2012 | Murmann et al. | 375/224 |
| 2010/0003935 A1 | * | 1/2010 | Behzad et al. | 455/132 |
| 2013/0016798 A1 | * | 1/2013 | Velazquez et al. | 375/340 |
| 2013/0242772 A1 | * | 9/2013 | Attar et al. | 370/252 |

* cited by examiner

*Primary Examiner* — Khanh C Tran
(74) *Attorney, Agent, or Firm* — Sterne, Kessler, Goldstein & Fox P.L.L.C.

(57) ABSTRACT

An auxiliary reduced power analog-to-digital converter (ADC) is provided for use during sleep periods of a receiver. The auxiliary ADC has a reduced dynamic range but sufficient accuracy to allow demodulation of signaling information contained in an input signal and to update control parameters used for synchronization and channel estimation. As such, a main higher power, higher dynamic range ADC can be turned off during sleep periods, reducing receiver power consumption. The main ADC is turned on at the end of a sleep period, and the receiver can be ready for receiving data immediately using the main ADC because the control parameters are maintained up to date during the sleep period using the auxiliary ADC.

21 Claims, 6 Drawing Sheets

RECEIVER WITH REDUCED WAKE-UP TIME

FIELD OF THE INVENTION

The present disclosure relates generally to receiver wake-up and synchronization.

BACKGROUND

Background Art

In most Orthogonal Frequency Division Multiplexing (OFDM) systems, the receiver must determine a number of control parameters before it may begin receiving data. These control parameters include, for example, a time offset estimate, a carrier frequency offset estimate, and a channel profile estimate. Typically, determination of the control parameters requires a nontrivial amount of time, which creates a delay problem every time that the receiver needs to establish/re-establish the control parameters. This is particularly relevant when the receiver employs a sleep (power saving) mode, which requires re-acquiring the control parameters after every sleep cycle. This delay problem is further complicated by the fact that, in OFDM standards, MAC (Medium Access Control) scheduling algorithms preclude notifying the receiver in advance of an upcoming wake up time so that the receiver can acquire/re-acquire the control parameters before it is due to receive data. As a result, the receiver is required to wake up from the sleep mode and to establish/re-establish the control parameters in the shortest amount of time possible upon wake up.

BRIEF DESCRIPTION OF THE DRAWINGS/FIGURES

The accompanying drawings, which are incorporated herein and form a part of the specification, illustrate the present disclosure and, together with the description, further serve to explain the principles of the disclosure and to enable a person skilled in the pertinent art to make and use the disclosure.

The present disclosure will be described with reference to the accompanying drawings. Generally, the drawing in which an element first appears is typically indicated by the leftmost digit(s) in the corresponding reference number.

DETAILED DESCRIPTION OF EMBODIMENTS

For purposes of this discussion, the term "module" shall be understood to include at least one of software, firmware, and hardware (such as one or more circuits, microchips, or devices, or any combination thereof), and any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

Figure 1:
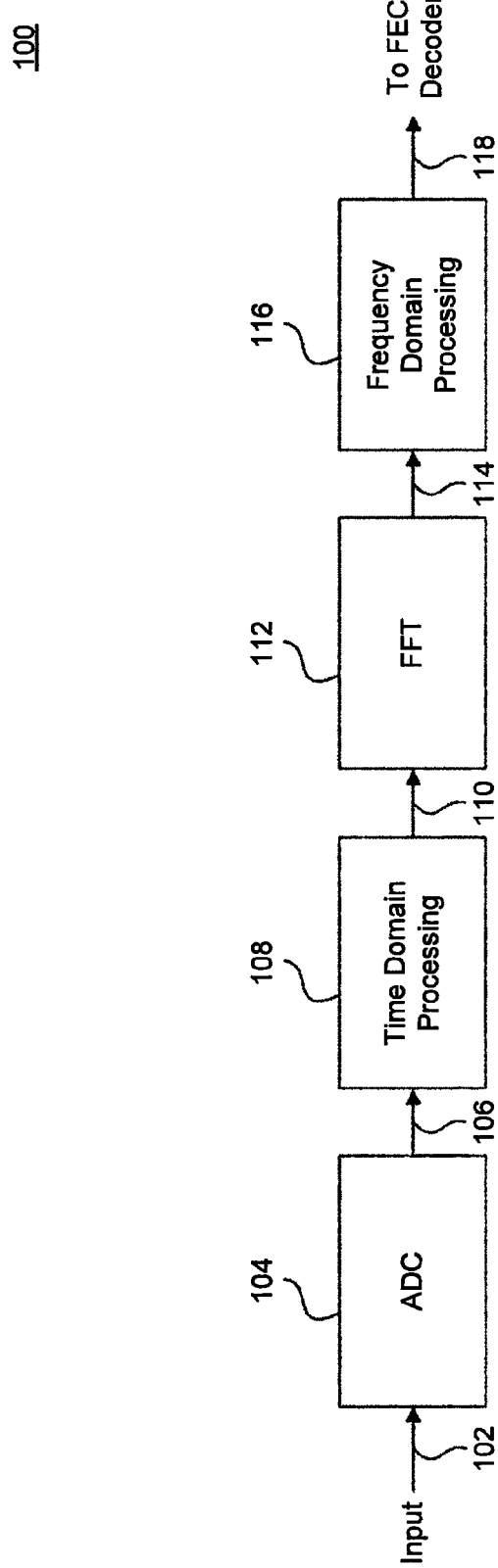
FIG. 1 illustrates an example receiver.

FIG. 1 illustrates an example receiver 100. Example receiver 100 is provided for the purpose of illustration only and is not limiting of embodiments. Example receiver 100 can be configured for receiving Orthogonal Frequency Division Multiplexing (OFDM) type signals, such as DVB-T2 (Digital Video Broadcasting—Second Generation Terrestrial), DVB-H (Digital Video Broadcasting—Handheld), DVB-C2 (Digital Video Broadcasting—Second Generation Cable), ISDB-T (Integrated Services Digital Broadcasting—Terrestrial), EPoC (Ethernet Passive Optical Network over Coaxial), and DOCSIS (Data Over Cable Service Interface Specification) 3.1 signals, for example.

As shown in FIG. 1, example receiver 100 includes, among other elements, an analog-to-digital converter (ADC) 104, a time domain processing module 108, a Fast Fourier Transform (FFT) module 112, and a frequency domain processing module 116. Receiver 100 receives an analog input signal 102, which results from a transmitter (not shown in FIG. 1) transmitting a signal to receiver 100.

ADC 104 receives analog input signal 102 and produces a digital output signal 106 that is a digital quantization of analog input signal 102. In typical OFDM receivers, digital output signal 106 is a 10-bit or 11-bit output. Output signal 106 of ADC 104 is then processed by time domain processing module 108, which applies one or more of a time offset correction, a carrier frequency offset correction, and automatic gain control (AGC) to digital output signal 106 to produce signal 110. Typically, the time offset correction and the carrier frequency correction applied by module 108 to output signal 106 are based respectively on pre-determined time offset and carrier frequency offset estimates (which estimate differences in time and frequency) between the transmitter and receiver 100.

FFT module 112 receives signal 110 and produces a discrete Fourier transform (DFT) signal 114 based on signal 110. Processing performed by FFT module 112 on signal 110 is well known to a person of skill in the art. Frequency domain processing module 116 receives DFT signal 114 and uses DFT signal 114 to generate/update one or more parameters, including a time offset estimate between the transmitter and receiver 100, a carrier frequency offset estimate between the transmitter and receiver 100, a channel profile estimate of a channel between the transmitter and receiver 100, and a trigger position for use by FFT module 112 (hereinafter collectively referred to as control parameters). Module 116 then outputs a signal 118 to subsequent blocks of receiver 100, for example an FEC (Forward Error Correction) decoder, for retrieving data embedded in input signal 102.

Generally, the control parameters generated by module 116 need to be determined prior to beginning to receive data destined to receiver 100. For example, the time offset estimate and the carrier frequency offset estimate are needed to synchronize the transmitter and receiver 100. The channel estimate is needed to properly demodulate data embedded in input signal 102. In typical OFDM receivers, these control parameters are determined by retrieving and processing signaling information embedded in input signal 102. This signaling information is typically contained in pilot symbols/tones and/or other signaling symbols/tones such as TPS (Transmission Parameters Signaling) in DVB-T/H or TMCC (Transmission Multiplexing Configuration Control) in ISDB-T, for example.

Typically, determination of the above described control parameters requires a nontrivial amount of time. This creates a delay problem every time that the receiver needs to establish/re-establish these control parameters, and more particularly, when the receiver employs a sleep (power saving) mode (in which the receiver turns off some of its modules during a sleep cycle and then turns them back on at the end of the sleep cycle), which requires re-acquiring the control parameters after every sleep cycle. This delay problem is further complicated by the fact that, in OFDM standards, MAC (Medium Access Control) scheduling algorithms preclude notifying the receiver in advance of an upcoming wake up time so that the receiver can acquire/re-acquire the control parameters before it is due to receive data. As a result, the receiver is required to wake up from the sleep mode and to establish/re-establish the control parameters in the shortest amount of time possible upon wake up.

Embodiments of the present disclosure, as further described below, provide a low cost, efficient solution for maintaining the above described control parameters current in a receiver throughout sleep periods of the receiver. In an embodiment, an auxiliary reduced power ADC is provided for use during sleep periods of the receiver. The auxiliary ADC has a reduced dynamic range but sufficient accuracy to allow demodulation of the signaling information contained in the input signal and to update the control parameters. As such, a main higher power, higher dynamic range ADC can be turned off during sleep periods, reducing receiver power consumption. The main ADC is turned on at the end of a sleep period, and the receiver can be ready for receiving data immediately using the main ADC because the control parameters are maintained up to date during the sleep period.

In another embodiment, an auxiliary reduced power receiver processing chain (including the auxiliary ADC) is provided for use during sleep periods of the receiver. The auxiliary processing chain is used for processing the input signal during sleep periods of the receiver to retrieve the signaling information only from the input signal. As such, a main receiver processing chain (including the main ADC) can be turned off during sleep periods, further reducing receiver power consumption. The main processing chain is turned on at the end of a sleep period, and the receiver can be ready for receiving data immediately (with minimal wake up time) using the main processing chain because the control parameters are maintained up to date during the sleep period. Embodiments, as further described below, are not limited for use in relation to the receiver entering sleep mode periods, but can be extended to the receiver changing operating states, such that the input signal is processed using the auxiliary ADC/auxiliary processing chain in a first operating state of the receiver and using the main ADC/main processing chain in a second operating state of the ADC.

As further described below, embodiments are particularly suited for OFDM receivers. Specifically, most OFDM standards (e.g., ISDB-T, DVB-T/T2, DVB-H, DVB-C2, etc.) use low data modulation orders for transmitting signaling information. For example, commonly, signaling information is transmitted in BPSK (Binary Phase Shift Keying) or QPSK (Quadrature Phase Shift Keying) modulated pilot symbols/tones. Further, OMNI standards typically have very noise-robust algorithms (or which can be readily modified to handle higher noise) for demodulating signaling information. As a result, when the receiver input signal represents signaling information, the input signal can be quantized with a low dynamic range ADC (e.g., 5-bit or 6-bit output) with higher quantization noise, without affecting the ability of the receiver to demodulate the signaling information. This reduces the receiver power consumption but enables the demodulation of all that is required to retrieve the control parameters, allowing for reduced receiver wake up time. Furthermore, the use of low dynamic range ADC for signaling information does not disturb other aspects of receiver operation because, apart from quantization noise, low dynamic range ADCs have identical or similar group delay, bandwidth, non-linear characteristics, and sampling frequency as high dynamic range ADCs.

Figure 2:
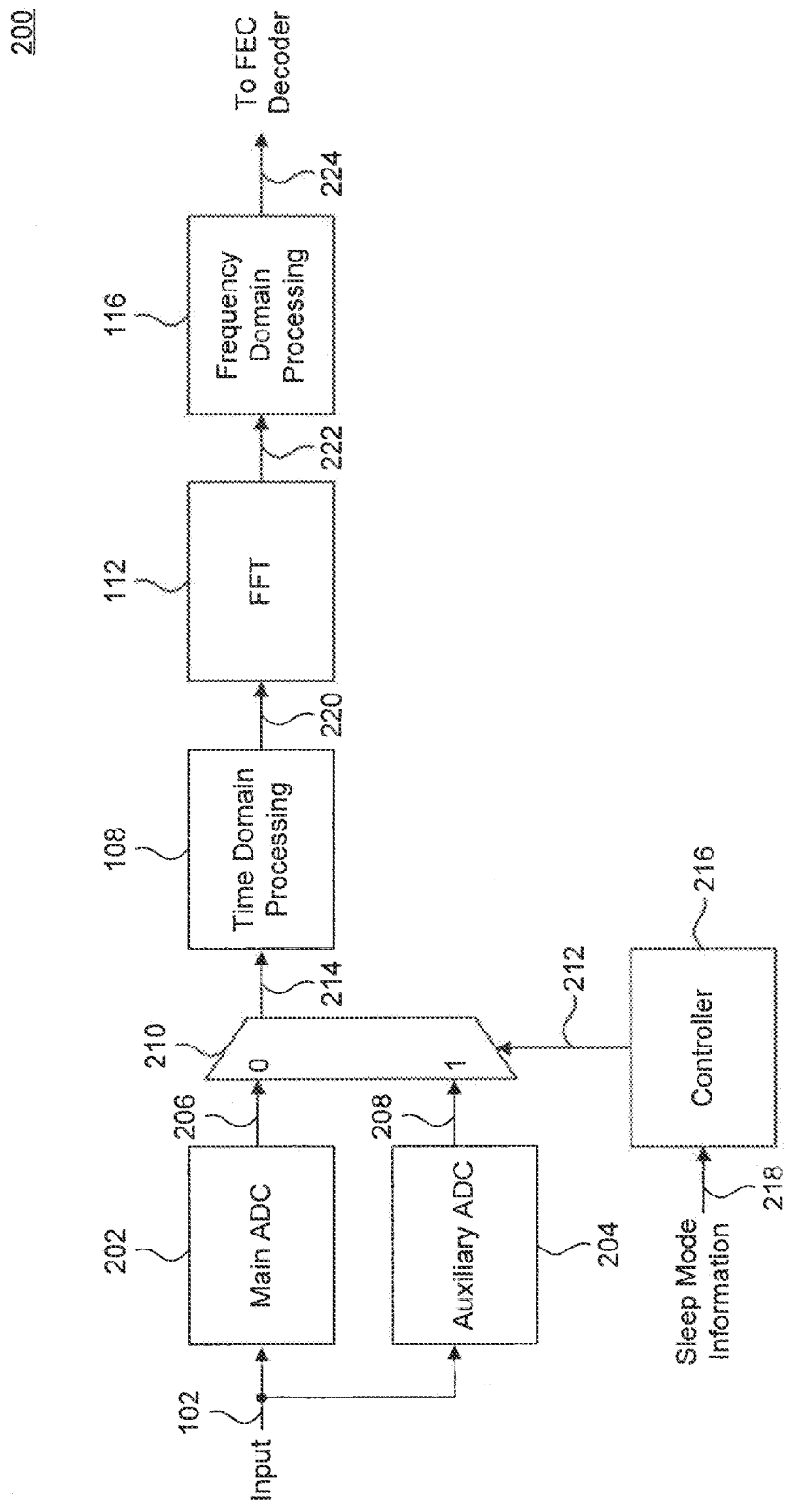
FIG. 2 illustrates an example receiver according to an embodiment.

FIG. 2 illustrates an example receiver 200 according to an embodiment. Example receiver 200 is provided for the purpose of illustration only and is not limiting of embodiments. Example receiver 200 can be configured for receiving OFDM type signals. As shown in FIG. 2, example receiver 200 includes a main ADC 202, an auxiliary ADC 204, a multiplexer 210, a controller 216, and like example receiver 100, a time domain processing module 108, a FFT module 112, and a frequency domain processing module 116. In an embodiment, auxiliary ADC 204 has a lower dynamic range than main ADC 202. For example, auxiliary ADC 204 may produce a 5-bit or 6-bit output, while main ADC 202 may produce a 10-bit or 11-bit output. Receiver 200 receives an analog input signal 102, which results from a transmitter (not shown in FIG. 2) transmitting a signal to receiver 200.

In operation, controller 216 is configured to receive sleep mode information 218 and to generate a control signal 212 for multiplexer 210 in response to sleep mode information 218. Sleep mode information 218 can include a sleep Mode end instruction indicating the end of a sleep period of receiver 200 or a sleep mode begin instruction indicating the beginning of a sleep period of receiver 200. In an embodiment, sleep mode information 218 is provided to controller 216 by higher layer modules (e.g., MAC layer) of a device (e.g., cable modem, mobile device, etc.) using receiver 200. For example, sleep mode information 218 can be generated by power-saving features implemented by the device. These features may turn off/on parts of receiver 200 when signaled by a transmitter (Can be done using signaling information in input signal 102 or through an out-of-band signaling channel), when no data transmission to receiver 200 is anticipated, and/or at pre-determined (can be recurring) sleep/wake-up times.

Multiplexer 210 is configured to receive a first ADC signal 206 and a second ADC signal 208. First ADC signal 206 is generated by main ADC 202 in response to input signal 102. Second ADC signal 208 is generated by auxiliary ADC 204 in response to input signal 102. Multiplexer 210 outputs first ADC signal 206 or second ADC signal 208, responsive to control signal 212, as an output signal 214 to time domain processing module 108.

Specifically, when sleep mode information 218 includes a sleep mode end instruction, multiplexer 210 outputs first ADC signal 206 as output signal 214 to time domain processing module 108. Alternatively, when sleep mode information 218 includes a sleep mode begin instruction, multiplexer 210 outputs second ADC signal 208 as output signal 214 to time domain processing module 108. It is noted that the switching between the high dynamic range, first ADC signal 206 and the low dynamic range, second ADC signal 208 as output signal 214 does not disturb other aspects of receiver operation because, apart from quantization noise, low dynamic range ADCs have identical or similar group delay, bandwidth, non-linear characteristics, and sampling frequency as high dynamic range ADCs.

In an embodiment, during the sleep mode cycle, input signal 102 contains signaling information only, and therefore second. ADC signal 208 includes a representation of signaling information only. Most OFDM standards use low data modulation orders (e.g. low density constellations) for transmitting signaling information and have very noise-robust algorithms (or which can be readily modified to handle higher noise) for demodulating signaling information. For example, commonly, signaling information is transmitted in BPSK or QPSK modulated pilot symbols/tones. As a result, the quantization of input signal 102 using the low dynamic range, higher quantization noise auxiliary ADC 204 does not affect the ability of receiver 200 to demodulate the signaling information. This is the case irrespective of whether the tones carrying the signaling information are scattered across the entire operational frequency band of the receiver or grouped together in signaling channel of the operational frequency band.

In an embodiment, in addition to controlling multiplexer 210 as described above, controller 216 is further configured to turn on main ADC 202 and turn off auxiliary ADC 204 when sleep mode information 218 includes a sleep mode end instruction, and to turn on auxiliary ADC 204 and turn off main ADC 202 when sleep mode information 218 includes a sleep mode begin instruction. As such, only one of main ADC 202 and auxiliary ADC 204 is turned on at any given time and only one of first ADC signal 206 and second ADC signal 208 is active at any given time.

Output signal 214 of multiplexer 210 is processed by time domain processing module 108 as described above in FIG. 1. Specifically, module 108 applies one or more of a time offset correction, a carrier frequency offset correction, and automatic gain control (AGC) to output signal 214 to produce signal 220. Typically, the time offset correction and the carrier frequency correction applied by module 108 to output signal 214 are based respectively on pre-determined time offset and carrier frequency offset estimates (which estimate differences in time and frequency) between the transmitter and receiver 200.

FFT module 112 receives signal 220 and produces a discrete Fourier transform (DFT) signal 222 based on signal 220. Processing performed by FFT module 112 on signal 220 is well known to a person of skill in the art. Frequency domain processing module 116 receives DFT signal 222 and uses DFT signal 222 to generate/update one or more control parameters, including a time offset estimate between the transmitter and receiver 200, a carrier frequency offset estimate between the transmitter and receiver 200, a channel profile estimate of a channel between the transmitter and receiver 200, and a trigger position for use by FFT module 112. In an embodiment, the control parameters generated/updated by module 116 are stored in one or more memory (not shown in FIG. 2) for use by respective modules of receiver 200, such as time domain processing module 108 and FFT module 112.

In an embodiment, module 116 then outputs a signal 224 to subsequent blocks of receiver 200, for example an FEC (Forward Error Correction) decoder, for retrieving data embedded in input signal 102. In an embodiment, module 116 outputs signal 224 only when receiver 200 is not in sleep mode (when input signal 102 contains data to be decoded). Otherwise, when receiver 200 is in sleep mode, module 116 only generates/updates the control parameters without forwarding signal 224 to subsequent blocks of receiver 200.

As described above, auxiliary ADC 204 has a lower dynamic range (e.g., half width) than main ADC 202, and as a result significantly lower power consumption. For example, a typical 10-bit ADC consumes on the order of 500 mW, while a 5-bit ADC consumes on the order of 20 mW only. This means that significant receiver power savings can be achieved by using auxiliary ADC 204 (and turning off main ADC 202) during sleep periods of receiver 200. Further, the control parameters needed for maintaining synchronization with the transmitter and/or for channel estimation, for example, can be retrieved from input signal 102 using auxiliary ADC 204 without affecting any operational aspect of receiver 200. This significantly reduces the time needed for receiver 200 to become ready for receiving data upon wake up from a sleep period.

Figure 6:
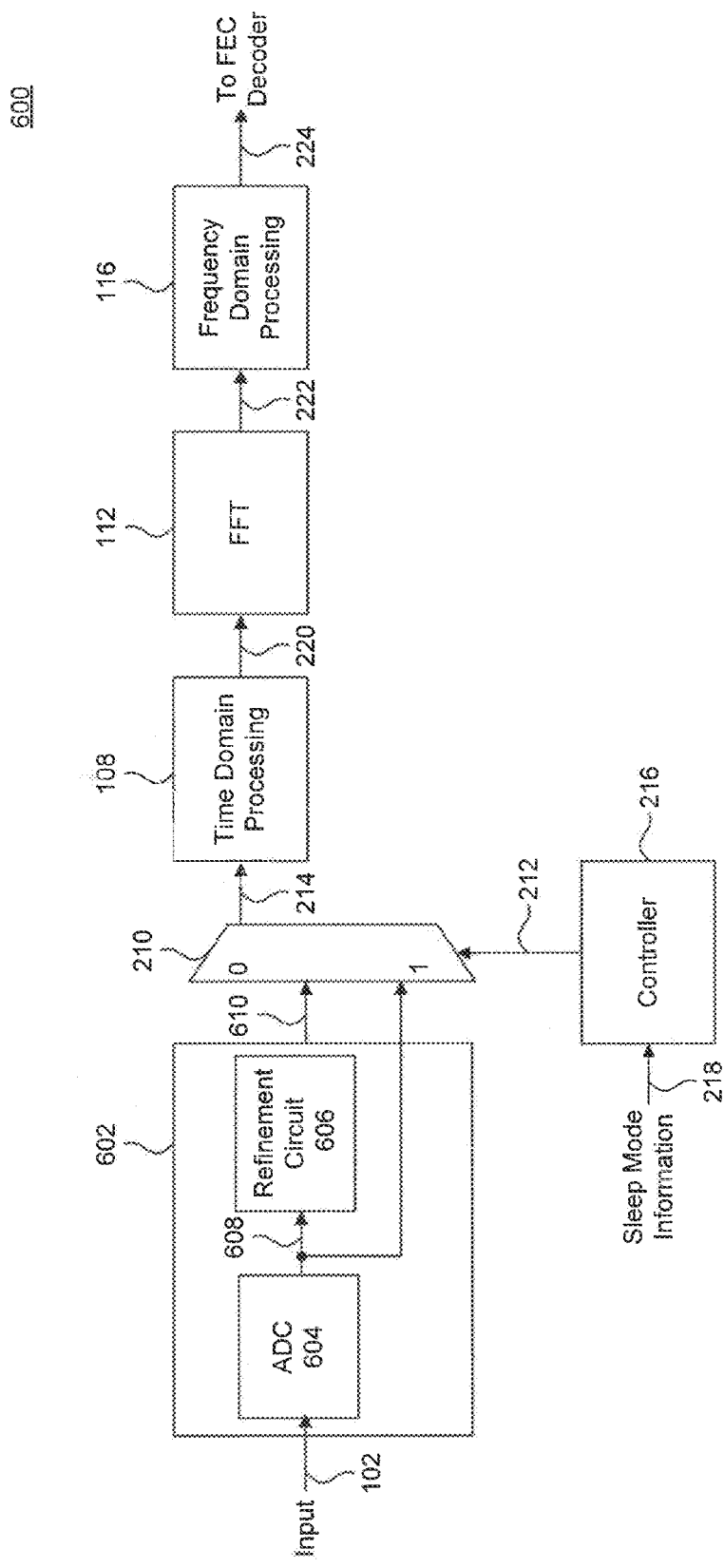
FIG. 6 illustrates another example receiver according to an embodiment.

FIG. 6 illustrates another example receiver 600 according to an embodiment. Example receiver 600 is provided for the purpose of illustration only and is not limiting of embodiments. Example receiver 600 can be configured for receiving OFDM type signals. As shown in FIG. 6, example receiver 600 includes a two-stage ADC 602, including an ADC 604 and a refinement circuit 606; and like example receiver 200, also includes a multiplexer 210, a controller 216, a time domain processing module 108, a FFT module 112, and a frequency domain processing module 116. Receiver 600 receives an analog input signal 102, which results from a transmitter (not shown in FIG. 6) transmitting a signal to receiver 600.

In an embodiment, ADC 604 is a low power, low dynamic range ADC. For example, ADC 604 may produce a 5-bit or 6-bit output 608. Refinement circuit 606, when active, acts on output 608 of ADC 604 to produce a higher-bit (e.g., 10-bit or 11-bit) output 610. Outputs 608 and 610 are provided to multiplexer 210, which selects one or the other as output signal 214 based on control signal 212 from controller 216.

In operation, controller 216 is configured to turn on both ADC 604 and refinement circuit 606 when sleep mode information 218 includes a sleep mode end instruction, and to turn off refinement circuit 606 when sleep mode information 218 includes a sleep mode begin instruction. Further, when sleep mode information 218 includes a sleep mode end instruction, controller 216 controls multiplexer 210 to provide output 610 to time domain processing module 108. Alternatively, when steep mode information 218 includes a sleep mode begin instruction, controller 216 controls multiplexer 210 to provide output 608 to time domain processing module 108. Other aspects of operation of example receiver 600 are similar to example receiver 200 described above.

Figure 3:
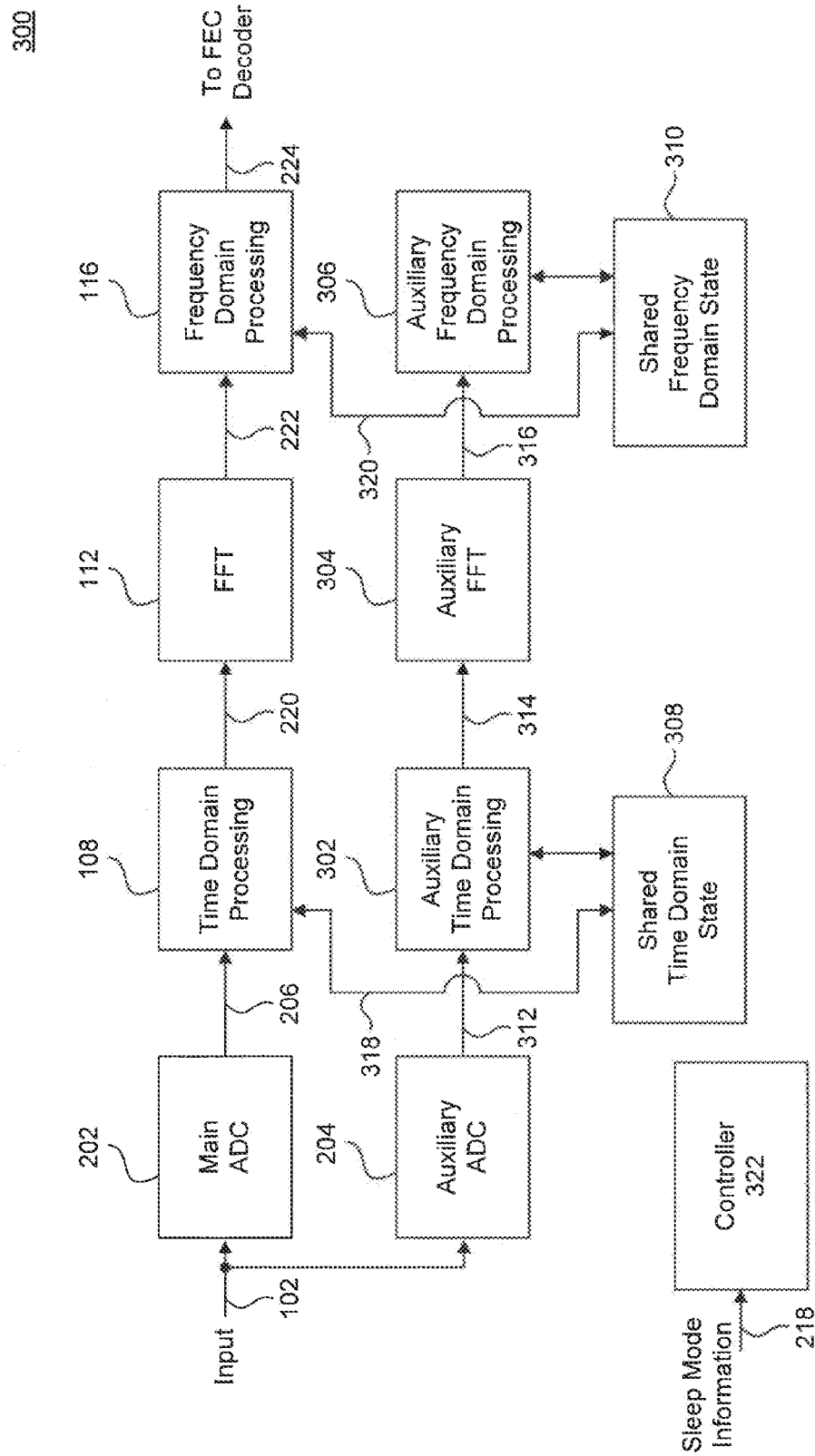
FIG. 3 illustrates another example receiver according to an embodiment.

FIG. 3 illustrates another example receiver 300 according to an embodiment. Example receiver 300 is provided for the purpose of illustration only and is not limiting of embodiments. Example receiver 300 can be configured for receiving OFDM type signals. As shown in FIG. 3, example receiver 300 includes a main processing chain, which includes a main ADC 202, a time domain processing module 108, a FFT module 112, and a frequency domain processing module 116; an auxiliary processing chain, which includes an auxiliary ADC 204, an auxiliary time domain processing module 302, an auxiliary FFT module 304, and an auxiliary frequency domain processing module 306; a shared time domain state memory 308; a shared frequency domain state memory 310; and a controller 322. Main ADC 202 and auxiliary ADC 204 are as described above with respect to FIG. 2. Receiver 300 receives an analog input signal 102, which results from a transmitter (not shown in FIG. 3) transmitting a signal to receiver 300.

In operation, controller 322 controls receiver 300 to tarn on/off the main processing chain and the auxiliary processing chain according to the operating state of receiver 300. In an embodiment, controller 300 is configured to turn on the main processing chain to process input signal 102 (and additionally turn off the auxiliary processing Chain) in a first operating state of receiver 300; and to turn on the auxiliary processing chain to process input signal 102 (and additionally turn off the main processing chain) in a second operating state of receiver 300. In an embodiment, the first and second operating states of receiver 300 correspond respectively to a normal power mode and a sleep mode of receiver 300, such that input signal 102 is processed by the main processing chain during the normal power mode and is processed by the auxiliary processing chain during the sleep mode of receiver 300.

In an embodiment, operation of the main processing chain to process input signal 102 is as described above with respect to FIG. 2. Specifically, the main processing chain processes input signal 102 to retrieve data and signaling information embedded in input signal 102. Module 116 of the main receiver chain generates/updates the control parameters, and in an embodiment, stores the control parameters in shared time domain state memory 308 and/or shared frequency domain state memory 310. Module 116 further outputs a signal 224 to subsequent blocks of receiver 300 for decoding any data contained in input signal 102.

The auxiliary processing chain processes input signal 102 similarly to the main processing chain, but may employ lower overall processing power by implementing only a reduced set of the functions implemented by the main processing chain. Specifically, in an embodiment, module 306 implements only the functions needed to retrieve signaling information from input signal 102 in order to generate/update the control parameters, but produces no output to subsequent blocks of receiver 300. To further save power, the auxiliary processing chain shares shared time domain state memory 308 and/or shared frequency domain state memory 310 with the main processing chain to store/access the generated/updated control parameters. For example, either of time domain processing module 108 or auxiliary time domain processing module 302 may access memory 308 to retrieve synchronization control parameters (e.g., time offset estimate, carrier frequency offset, etc.). This sharing is facilitated by the fact that only one of the main processing chain and the auxiliary processing chain is turned on at any given time.

As in example receiver 200 described above, with auxiliary ADC 204 having a lower dynamic range than main ADC 202, significant power savings can be achieved by using the auxiliary processing chain to process input signal 102 during sleep periods of receiver 300. These power savings are further increased in receiver 300 by the lower overall power consumption of the rest of the auxiliary processing chain compared to the main processing chain. Further, the control parameters needed for maintaining synchronization with the transmitter and/or for channel estimation, for example, can be retrieved from input signal 102 using the auxiliary processing chain during sleep periods of receiver 300, and are made ready for use by the main processing chain immediately upon wake up from a sleep period, without requiring any change in the operation of the main processing chain. This significantly reduces the time needed for receiver 300 to become ready for receiving data upon wake up from a sleep period.

The area increase of receiver 300 compared to receiver 200 is also not too significant. For example, typical OFDM receiver chips have generally 85-90% of their areas consumed by memory and only about 10-15% of their areas consumed by processing chains. Accordingly, receiver 300 can be implemented with only 10-15% additional area than receiver 200 in one embodiment.

Figure 4:
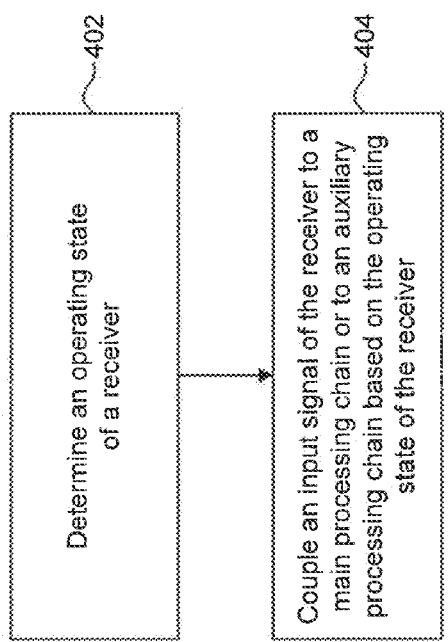
FIG. 4 is a flowchart of an example method of operating a receiver according to an embodiment.

FIG. 4 is a flowchart of an example method 400 of operating a receiver according to an embodiment. Example method 400 is provided for the purpose of illustration only and is not limiting of embodiments. Method 400 can be performed by a controller, such as controller 216 in example receiver 200 or controller 322 in example receiver 300.

As shown in FIG. 4, example method 400 begins in step 402, which includes determining an operating state of a receiver. In an embodiment, the receiver includes a first operating state, which may correspond to a normal power mode for example, and a second operating state, which may correspond to a sleep mode of the receiver. Step 402 may thus include determining the operating state of the receiver based on sleep mode information received from higher layer modules of the device that includes the receiver. For example, the sleep mode information can be generated by power-saving features implemented by the device. These features may turn off/on parts of the receiver when signaled by a transmitter, when no data transmission to the receiver is anticipated, and/or at pre-determined (can be recurring) sleep/wake-up times.

Subsequently, in step 404, method 400 includes coupling an input signal of the receiver to a main processing Chain or to an auxiliary processing chain based on the operating state of the receiver. In an embodiment, the main processing chain and the auxiliary processing each includes a respective ADC but share the rest of the processing chain as in example receiver 200 for example. In another embodiment, the main processing chain and the auxiliary processing chain are separate receiver chains as in example receiver 300 for example.

In an embodiment, step 404 further includes coupling the input signal of the receiver to the main processing chain when the receiver is in the first operating state and coupling the input signal of the receiver to the auxiliary processing chain when the receiver is in the second operating state. In an embodiment, the auxiliary processing chain is a reduced power chain compared to the main processing chain, and the input signal is coupled to the auxiliary processing chain when the receiver is in sleep mode.

Figure 5:
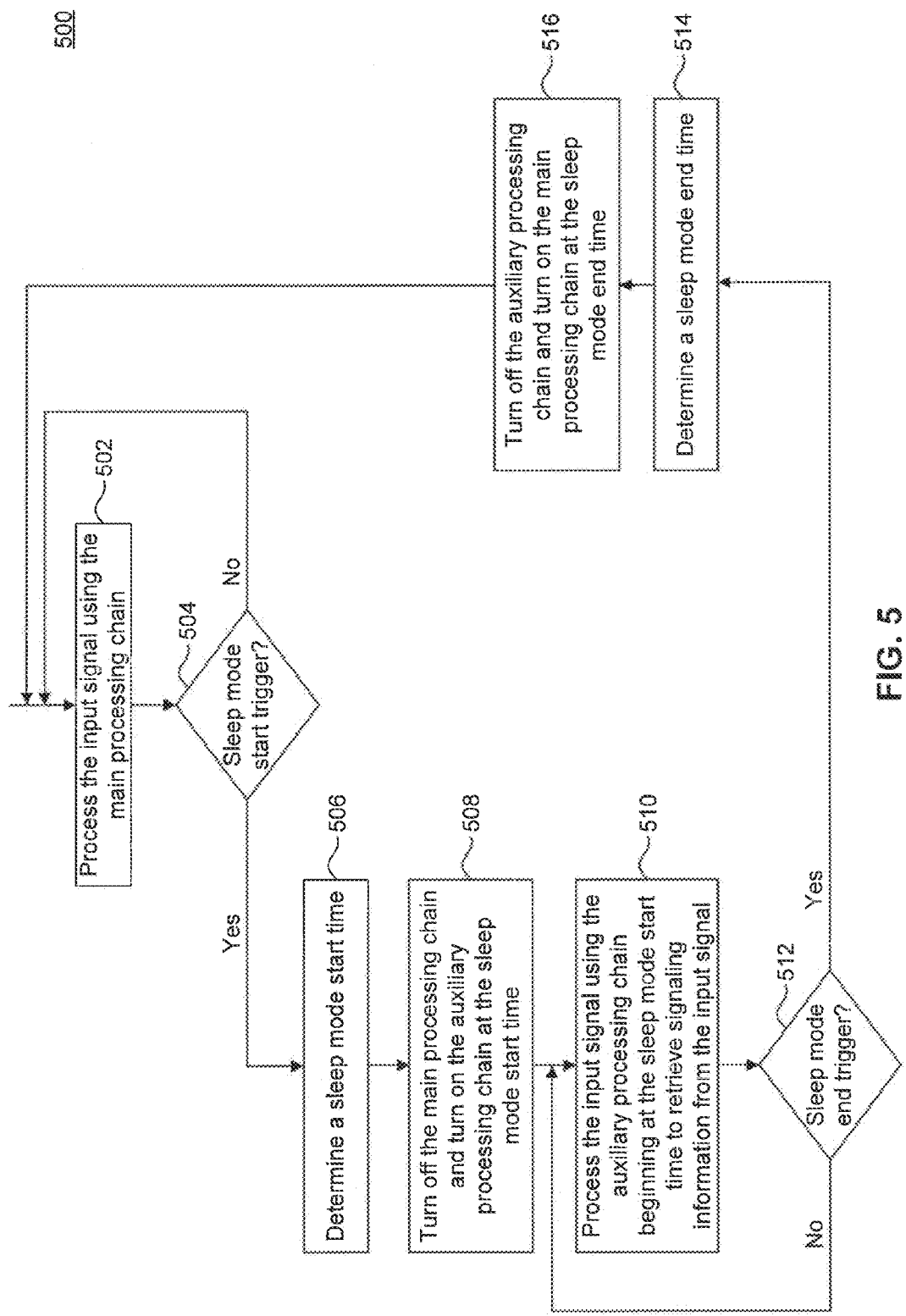
FIG. 5 is a flowchart of another example method of operating a receiver according to an embodiment.

FIG. 5 is a flowchart of another method 500 of operating a receiver according to an embodiment. Example method 500 is provided for the purpose of illustration only and is not limiting of embodiments. Method 500 can be performed by a receiver having a main processing chain and an auxiliary processing chain, such as example receivers 200 or 300 described above.

As shown in FIG. 5, example method 500 begins in step 502, which includes processing an input signal of the receiver using a main processing chain of the receiver. For example, the receiver may initially start in a normal power mode, for which the main processing chain of the receiver is used to retrieve data and/or signaling information embedded in the input signal.

Subsequently, step 504 includes determining whether or not a sleep mode start trigger is detected. In embodiments, the sleep mode start trigger may be due to transmitter instructions for the receiver to enter a sleep mode or a pre-determined sleep mode time alarm. If no sleep mode start trigger is detected, method 500 returns to step 502. Otherwise, method 500 proceeds to step 506.

Step 506 includes determining a sleep mode start time. In an embodiment, the sleep mode start time is indicated by the process that triggered the sleep mode start. For example, the sleep mode start time may be indicated in the transmitter instructions to the receiver or by the pre-determined sleep mode time alarm.

Subsequently, method 500 proceeds to step 508, which includes turning off the main processing chain and turning on the auxiliary processing Chain of the receiver at the determined sleep mode start time. Then, in step 510, method 500 includes processing the input signal using the auxiliary processing chain beginning at the sleep mode start time. In an embodiment, step 510 includes processing the input signal to retrieve only signaling information from the input signal. This allows the receiver to maintain time/frequency synchronization with the transmitter and an updated channel estimate, with reduced power consumption.

Subsequently, step 512 includes determining whether or not a sleep mode end trigger is detected. In embodiments, the Sleep mode end trigger may be due to transmitter instructions for the receiver to wake up or a pre-determined wake up time alarm. If no sleep mode end trigger is detected, method 500 returns to step 510. Otherwise, method 500 proceeds to step 514.

Step 514 includes determining a sleep mode end time. In an embodiment, the sleep mode end time is indicated by the process that triggered the sleep mode end. For example, the sleep mode end time may be indicated in the transmitter instructions to the receiver or by the wake up time alarm.

Subsequently, method 500 proceeds to step 516, which includes turning off the auxiliary processing chain and turning on the main processing chain of the receiver at the determined sleep mode end time, before returning to step 502.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general Concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present disclosure should not be limited by any of the above-described exemplary embodiments, but should be defined only in accordance with the following claims and their equivalents.

What is claimed is:

1. A receiver, comprising:
    a first analog-to-digital converter (ADC) configured to receive an input signal and to produce a first ADC signal;
    a second ADC configured to receive the input signal and to produce a second ADC signal;
    a receiver processing chain;
    a controller configured to receive sleep mode information of the receiver and to generate a control signal in response to the sleep mode information; and
    a multiplexer configured to receive the first and second ADC signals and to output the first ADC signal or the second ADC signal as an output signal to the receiver processing chain in response to the control signal.

2. The receiver of claim 1, wherein the second ADC has a lower dynamic range than the first ADC.

3. The receiver of claim 1, wherein the first ADC signal includes a larger number of bits than the second ADC signal.

4. The receiver of claim 1, wherein the receiver processing chain comprises:
    a time domain processing module configured to receive the output signal of the multiplexer and to apply at least one of a time offset correction, a carrier frequency offset correction, and automatic gain control (AGC) to the output signal to produce a modified output signal;
    a Fast Fourier Transform (FFT) module configured to receive the modified output signal and to produce a discrete Fourier transform of the modified output signal; and
    a frequency domain processing module configured to receive the discrete Fourier transform and to estimate at least one of a time offset between the receiver and a transmitter of the input signal, a carrier frequency offset between the receiver and the transmitter, a channel estimate of a channel between the receiver and the transmitter, and a trigger position of the FFT module.

5. The receiver of claim 1, wherein the multiplexer is configured to output the first ADC signal as the output signal to the receiver processing chain when the sleep mode information includes a sleep mode end instruction, and to output the second ADC signal as the output signal to the receiver processing chain when the sleep mode information includes a sleep mode begin instruction.

6. The receiver of claim 5, wherein the second ADC signal includes a representation of signaling information only.

7. The receiver of claim 5, wherein the controller is further configured to turn on the first ADC and turn off the second ADC when the sleep mode information includes the sleep mode end instruction, and to turn on the second ADC and turn off the first ADC when the sleep mode information includes the sleep mode begin instruction.

8. A receiver, comprising:
    a first receiver processing chain, including a first analog-to-digital converter (ADC); and
    a second receiver processing chain, including a second ADC; and
    a memory that stores one or more control parameters used by the first receiver processing chain and the second receiver processing chain to maintain synchronization during processing of an input signal of the receiver,
    wherein the first receiver processing chain is configured to process the input signal of the receiver when the receiver is in a normal power mode, and wherein the second receiver processing chain is configured to process the input signal of the receiver when the receiver is in a sleep mode, and
    wherein the second receiver processing chain is configured to update the one or more control parameters based on processing of the input signal during the sleep mode of receiver.

9. The receiver of claim 8, wherein the second ADC has a lower dynamic range than the first ADC.

10. The receiver of claim 8, wherein a first output signal produced by the first ADC in processing the input signal includes a larger number of bits than a second output signal produced by the second ADC in processing the input signal.

11. The receiver of claim 8, wherein the first receiver processing chain is configured to process the input signal to retrieve data embedded in the input signal.

12. The receiver of claim 8, wherein the second receiver processing chain is configured to process the input signal to retrieve only signaling information from the input signal.

13. The receiver of claim 8, wherein the first receiver processing chain is configured to retrieve the updated one or more control parameters from the memory upon transition from the sleep mode to the normal power mode.

14. The receiver of claim 8, wherein the control parameters include one or more of a time offset estimate, a carrier frequency offset estimate, or a channel profile estimate.

15. A method of operating a receiver, comprising:
- determining an operating state of a receiver, wherein determining the operating state of the receiver comprises identifying a sleep mode start trigger or a sleep mode end trigger; and
- coupling an input signal of the receiver to a main processing chain or to an auxiliary processing chain based on the operating state of the receiver,
- wherein the main processing chain includes a first analog-to-digital converter (ADC) and the auxiliary processing chain includes a second ADC, and wherein the second ADC has a lower dynamic range than the first ADC.

16. The method of claim 15, wherein the sleep mode start trigger is identified, the method further comprising:
- determining a sleep mode start time;
- turning off the main processing chain and turning on the auxiliary processing chain at the sleep mode start time;
- coupling the input signal to the auxiliary processing chain; and
- processing the input signal using the auxiliary processing chain beginning at the sleep mode start time to retrieve signaling information from the input signal.

17. The method of claim 16, wherein the signaling information is contained in low modulation order symbols of the input signal.

18. The method of claim 15, wherein the sleep mode end trigger is identified, the method further comprising:
- determining a sleep mode end time;
- turning off the auxiliary processing chain and turning on the main processing chain at the sleep mode end time;
- coupling the input signal to the main processing chain; and
- processing the input signal using the main processing chain beginning at the sleep mode end time to retrieve data embedded in the input signal.

19. A receiver, comprising:
- an analog-to-digital converter (ADC) configured to receive an input signal and to produce a first ADC signal;
- a refinement circuit, coupled to the ADC, configured to receive the first ADC signal and to generate a second ADC signal, wherein the second ADC signal includes a larger number of bits than the first ADC signal;
- a receiver processing chain; and
- a multiplexer configured to receive the first and second ADC signals and to output the first ADC signal or the second ADC signal as an output signal to the receiver processing chain in response to a control signal.

20. The receiver of claim 19, further comprising:
- a controller configured to receive sleep mode information of the receiver and to generate the control signal in response to the sleep mode information.

21. The receiver of claim 20, wherein the multiplexer is configured to output the first ADC signal as the output signal to the receiver processing chain when the sleep mode information includes a sleep mode end instruction, and to output the second ADC signal as the output signal to the receiver processing chain when the sleep mode information includes a sleep mode begin instruction.

* * * * *

UNITED STATES PATENT AND TRADEMARK OFFICE
CERTIFICATE OF CORRECTION

| | | |
|---|---|---|
| PATENT NO. | : 9,008,235 B2 | Page 1 of 1 |
| APPLICATION NO. | : 13/770683 | |
| DATED | : April 14, 2015 | |
| INVENTOR(S) | : Rajagopal et al. | |

It is certified that error appears in the above-identified patent and that said Letters Patent is hereby corrected as shown below:

In the Claims

Column 10, line 53, please replace "receiver" with --the receiver--

Signed and Sealed this
Fifteenth Day of September, 2015

Michelle K. Lee
*Director of the United States Patent and Trademark Office*